United States Patent [19]
Joyce

[11] Patent Number: 4,938,166
[45] Date of Patent: Jul. 3, 1990

[54] DEVICE FOR GROWING MULTI-LAYER CRYSTALS EMPLOYING SET OF MASKING ELEMENTS WITH DIFFERENT APERATURE CONFIGURATIONS

[75] Inventor: Robert L. Joyce, Newbury Park, Calif.

[73] Assignee: Hughes Aircraft Company, Los Angeles, Calif.

[21] Appl. No.: 156,252

[22] Filed: Feb. 16, 1988

Related U.S. Application Data

[62] Division of Ser. No. 846,411, Mar. 31, 1986, abandoned.

[51] Int. Cl.$^5$ ............................................... B05C 13/00
[52] U.S. Cl. ..................................... 118/500; 118/505; 118/406; 427/282; 148/DIG. 106; 156/621
[58] Field of Search ............... 118/406, 505, 504, 500; 427/282; 148/DIG. 25, DIG.106; 156/621, 624

[56] References Cited

U.S. PATENT DOCUMENTS

| | | | |
|---|---|---|---|
| 3,088,435 | 5/1963 | Wolff et al. | 118/504 |
| 3,348,962 | 10/1967 | Grossman et al. | 118/504 X |
| 3,546,010 | 12/1970 | Gartner et al. | 427/282 X |
| 3,715,245 | 2/1973 | Barnett et al. | 148/DIG. 106 |
| 4,235,191 | 11/1980 | Esselvhn | 156/621 X |

Primary Examiner—Shrive Beck
Assistant Examiner—Alain Bashore
Attorney, Agent, or Firm—Paul M. Coble; Wanda K. Denson-Low

[57] ABSTRACT

Disclosed is a device for making multi-layer crystals. It includes a holder and a plurality of masking elements adapted to be secured successively to the holder. The masking elements have cover pieces that overlie the area protected by the preceding cover pieces and have an additional cover piece. This produces a device having progressively truncated corner sections. There is thus formed a multi-layered crystal having portions adapted to be connected to electrical leads.

10 Claims, 2 Drawing Sheets

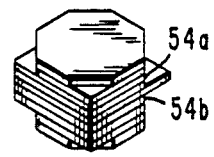
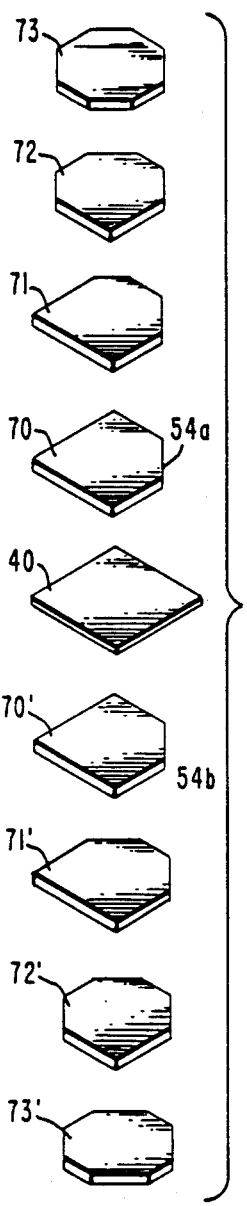
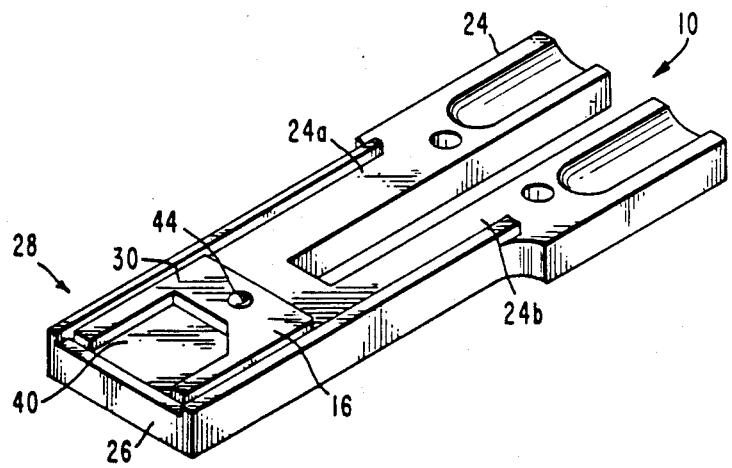

DEVICE FOR GROWING MULTI-LAYER CRYSTALS EMPLOYING SET OF MASKING ELEMENTS WITH DIFFERENT APERATURE CONFIGURATIONS

This invention was developed under a contract with the United States Government and is subject to the rights of the Government.

This is a division of application Ser. No. 846,411 filed Mar. 31, 1986, now abandoned.

BACKGROUND OF THE INVENTION

1. Field of the Invention

The invention relates to a method and device for growing multi-layer crystals and, in particular, to a device used to mask off portions of a substrate on which such a crystal is growing so that the various multi-layers have edge portions exposed that may be connected to electrical leads.

2. Description of Related Art

Solid-state electronic devices employ crystalline materials. These crystalline materials are very fragile and some devices require multi-layers of thin crystal material to be formed on a suitable crystalline substrate. When such multi-layered crystals are made, it is important that the successive layers of crystals have portions exposed so that these portions can be connected to electrical leads. The present techniques for accomplishing this are very cumbersome and frequently lead to the breakage of the crystalline material. Some crystalline materials are particularly fragile, and there are suitable ways to accomplishy this task without breakage.

SUMMARY OF THE INVENTION

The present invention provides both a simplified method and device for forming multi-layered crystals with edge portions exposed. Typically, a rectangular multi-layered crystal is formed by growing successive layers of crystalline material on a rectangular, preferably square shaped, crystalline substrate. It is not critical for the purposes of this invention what crystalline material is employed for the layers other than it is of the type that, upon melting and then cooling, will form the crystalline layer. A suitable crystalline material substrate is, for example, silver gallium sulfide ($AgGaS_2$). The same or different crystalline materials are then grown on this substrate. For example, these successive multi-layers of crystal may be gallium arsenide, but the layers will alternate between low resistivity and high resistivity. If the layers are essentially of the same material, the resistivity will be controlled by appropriate doping, as known in the art.

In accordance with this invention, the rectangular substrate is placed in a holder. The holder is made from a material which can withstand the high temperatures of the liquid crystal melt, in which the substrate and holder will be dipped. For example, the holder may be of graphite.

The holder has a window or opening in it, in which the substrate sits. The masking element leaves most of the substrate exposed except that a cover piece, usually a corner, rests over a holder over the substrate. A masking element is placed on the portion on the surface of the substrate. The substrate and masking element are detachably secured together to the holder. This assembly is dipped into a molten liquid crystal of low resistivity. The molten material is allowed to cool slowly while a thin layer of crystalline material is formed on the substrate. By proper control of residence time and temperature of the molten material, a thin, smooth layer can be produced; this will also depend on the nature of the molten material. This crystalline material, however, does not form on the surface of the substrate where the cover piece of the masking element rests on it.

When the thin layer of crystalline material is formed on the substrate, the assembly is removed from the bath, cleaned, the masking element is removed and a second masking element is placed in the holder over the substrate. The main difference between the two masking elements is that the second masking element includes two cover pieces, one of which corresponds in size, shape and location as the cover piece on the first masking element. The thickness of this cover piece is greater than the thickness of the second cover piece so that it sets in the recess or uncoated area created by the cover piece in the first masking element.

This assembly of holder, substrate, and the second masking element is then reinserted into a melt of high resistivity, which is again allowed to cool to form a second crystalline layer that overlies the first crystalline layer except where the cover pieces are located.

Upon removal of the holder from the liquid melt, the substrate has two layers on it. The substrate has one uncoated corner; the first layer has a void corresponding to that uncoated corner and a second corner that is uncoated. By progressively using additional masking elements which have additional cover pieces, additional crystalline layers of alternating resistivity may be added to the substrate and each layer will have a uniquely positioned exposed portion for electrical contact.

If the holder is open on both sides of the substrate, masking elements on each side of the substrate can be used to form crystalline layers on each side. For convenience, it is preferred that the successive pairs of masking elements have matching cover pieces.

BRIEF DESCRIPTION OF THE DRAWINGS

FIG. 1a is an exploded perspective of the multi-layered crystal made using the device of this invention, with the multi-layers being in the same relative positions as masking elements of FIG. 1 used to form them.

FIG. 2 is a perspective view of the holder, with the substrate and one masking element in place.

FIG. 3 is an exaggerated perspective view of an eight-layered crystal formed using the device of this invention.

DESCRIPTION OF THE PREFERRED EMBODIMENTS

Figure 1:
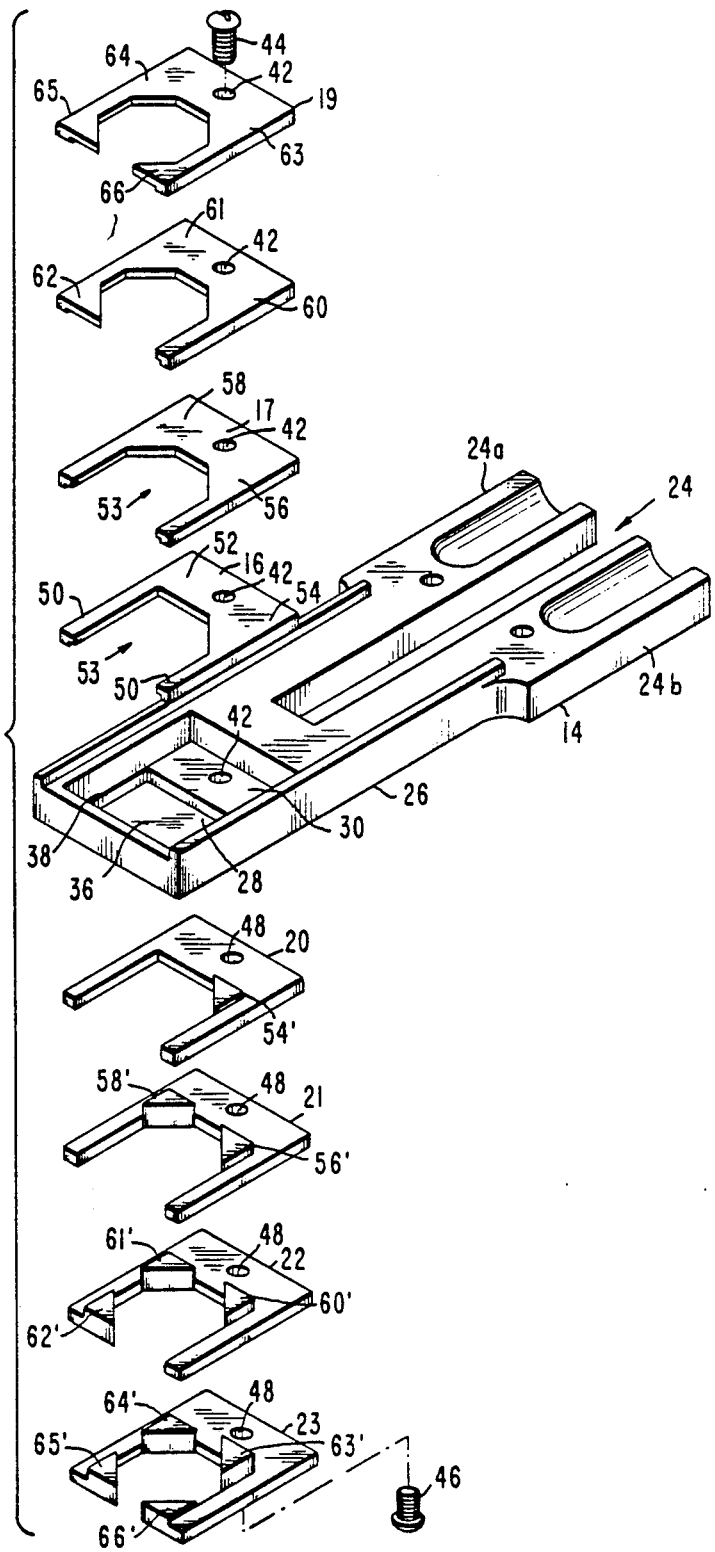
FIG. 1 is a perspective view of the holder of this invention and a set of the masking elements shown in exploded positions.

Referring to FIGS. 1 and 2, there is shown the holder 14 of this invention used to make multi-layered crystals and a plurality of masking elements, top elements 16-19 and bottom elements 20-23. The holder 14 is made of graphite and includes (1) a forked section 24, including two arms 24a and 24b which are adapteed to be connected to the insertion equipment (not shown) used to insert the holder into the liquid melt of the crystal material, and (2) a window section 26 in which the rectangular crystalline substrate is inserted. The window section 26 includes a rectangular recessed portion 28 and a plate member 30 integral with the side walls of recess portion 28. Along the sides of window 26 is a ledge 38 on which the crystalline substrate 40 is placed. The plate member 30 includes a threaded hole 42 which receives a graphite screw 44 that successively holds the four top masking elements 16–19 in position through openings 42. There is a complementary hole on the underside of the plate member 30 which successively holds the four bottom masking elements 20–23 in position when a second graphite screw 46 is inserted through aligned openings 48 in the masking elements 20–23.

Referring to the top masking elements 16–19, there is shown four almost identical masking elements which are adapted to be aligned and placed in registration so that they fit within the window section 26 and may be detachably secured by means of the screw 44. Each of these masking elements includes a pair of outwardly extending legs 50; these legs provide support to the masking elements and can be eliminated if the masking element is sufficiently strong. These legs are connected by an integral connecting member 52 and the legs and member define an opening 53.

Referring to masking element 16 in FIG. 1, there is shown a triangular cover piece 54 situated in one corner of the rectangular opening. The second masking element 17, as shown in FIG. 1, is similar to the first element 16, except that it has two cover pieces 56 and 58 situated in opposite corners. The third masking element 18, as shown in FIG. 1, again is similar to the elements 16 and 17, except that it has three cover pieces 60, 61, 62 situated at three corners. The fourth masking element 19 is the same as the preceeding elements 16, 17 and 18 except that it has four cover pieces 63, 64, 65 and 66 situated in each of its corners. The thickness of the cover pieces will vary in order to fit snugly in the unplated portions of the prior layers. This is best illustrated in FIG. 1 by cover pieces 54', 56', 58', 60', 61', 62', 63', 64', 65', 66' which shows the progressive thickening of the cover pieces. In the case of masking element 16, the cover piece 54 will be flush with the bottom surface of element 16 because this element rests directly on substrate 40, whereas cover piece 54' on masking element 20 must be thick enough to compensate for lower recess in window 36.

The Method:

The multiple layers of crystal material are formed on the substrate 40 (FIG. 2) in accordance with conventional practice. The significant difference is that the holder and successive masking elements are employed to block off portions of the multi-layers so that electrical leads can be connected to these layers.

In accordance with one method of this invention, the rectangular substrate 40 is placed in window 36 in the holder 14, resting on the ledge 38, and then the masking elements 16 and 20 are secured so that they overlie both the top and bottom sides of the substrate. With these masking elements 16 and 20 in place, the holder 14 is then placed in the liquid melt of the crystalline material and allowed to cool so that there is formed on the upper and lower surface of the substrate two distinct crystal layers. Because of the use of the cover pieces 54 and 54', the corner edges of the substrate 40 are blocked off so that the newly formed crystal layers have a truncated corner. This is best illustrated in FIG. 1a which shows the upper and lower crystal layers 70 and 70', respectively, formed as a result of the first immersion step. Because of the cover pieces 54 and 54', as illustrated in FIG. 1, the layers 70 and 70' will grow over the substrate except in corners 54a and 54b, respectively. As best illustrated in FIG. 1 with respect to masking elements 20, 21, 22 and 23, the thickness of the corner pieces progressively increases to fit snugly over prior uncoated areas.

The next step of the method consists of replacing masking elements 16 and 20 with the masking elements 17 and 21 in the holder. This assembly is then placed into the liquid melt and again two layers 71 and 71' (FIG. 1a) are formed on the previously formed layers 70 and 70', respectively.

The process is again repeated using the masking elements 18 and 22. The layers 72 and 72' formed in this step, as shown in FIG. 1a, have three truncated corners. The fourth set of masking elements 19 and 23 are attached to the holder 14 and this assembly is again reinserted into the liquid melt to form the final top and bottom layers 73 and 73' of the multi-layered cyrstal 12. The assembly is then removed from the liquid melt, cleaned, and the masking elements are detached from the holder 14. The multi-layered crystal 12 thus formed is shown in FIG. 3. This crystal 12 will have a number of edge portions, e.g., 54a and 54b, so exposed so that each layer may be connected to an electrical lead.

The above description presents the best mode contemplated of carrying out the present invention as depicted by the embodiment disclosed. The features illustrated by this embodiment provides the advantages of this invention. This invention is, however, susceptible to modifications and alternate constructions from the embodiment shown in the drawings and described above. Consequently, it is not the intention to limit it to the particular embodiment disclosed. On the contrary, the intention is to cover all modifications and alternates falling within the scope of the invention as generally expressed by the following claims.

What is claimed is:

1. A device used in growing multi-layered crystals on a substrate comprising:
   a holder member adapted to be inserted into a liquid melt of the crystal material from which the multi-layered crystal material is grown, said holder member including an opening therein adapted to hold the substrate and expose opposing faces of the substrate to the liquid melt; and
   a plurality of pairs of masking elements adapted to be successively detachably secured to said holder member such that one masking element of each pair is disposed adjacent to one face of said substrate and the other masking element of each pair is disposed adjacent to the opposite face of said substrate, each masking element defining an open section along a plane parallel to said opposing faces of said substrate, the open section of each masking element having a configuration in said plane which is the same as that of the open section of the other masking element of its pair but different from the configuration of the open section of the other pairs of said masking elements.

2. A device used in growing multi-layered crystals on a substrate comprising:
   a holder member adapted to be inserted into a liquid melt of the crystal material from which the multi-layered crystal material is grown, said holder member including an opening therein adapted to hold the substrate and expose opposing faces of the substrate to the liquid melt; and
   first and second sets of masking elements, each set including a first and a second masking element adapted to be successively detachably secured to said holder member such that said first masking element of said first set is disposed adjacent to one face of said substrate while said first masking element of said second set is disposed adjacent to the opposite face of said substrate and said second masking element of said first set is disposed adjacent to said one face of said substrate while said second masking element of said second set is disposed adjacent to said opposite face of said substrate, each of said first and second masking elements of said first and second sets defining an open section along a plane parallel to said opposing faces of said substrate, the open section of said first masking element of said first set having a configuration in said plane which is the same as that of said first masking element of said second set but different from that of said second masking elements, the configuration of the respective open sections of said second masking elements of said first and second sets in said plane being the same as one another.

3. A device according to claim 2 wherein said second masking elements of said first and second sets have respective aligned cover piece portions adapted to cover respective portions of opposite faces of said substrate not covered by said first masking elements.

4. A device according to claim 3 wherein said open section of each of said masking elements of said first and second sets is rectangular, and said cover piece portions are disposed adjacent to a corner of the rectangular open section.

5. A device according to claim 3 wherein said cover piece portion of said first masking element of said second set has a thickness greater than that of said cover piece portion of said first masking element of said first set along a direction perpendicular to said plane.

6. A device according to claim 5 wherein said cover piece portion of said second masking element of said second set has a thickness greater than that of said cover piece portion of said second masking element of said first set and greater than that of said first masking element of said second set.

7. A device according to claim 2 wherein each of said first and second sets of masking elements includes a third masking element adapted to be detachably secured to said holder member such that said third masking element of said first set is disposed adjacent to said one face of said substrate while said third masking element of said second set is disposed adjacent to said opposite face of said substrate, each of said third masking elements of said first and second sets defining an open section along said plane having a configuration in said plane which is the same as that of the other of said third masking elements but different from that of said first and second masking elements.

8. A device according to claim 7 wherein said second masking elements of said first and second sets have respective aligned cover piece portions adapted to cover respective portions of opposite faces of said substrate not covered by said first masking elements, and said third masking elements of said first and second sets have respective aligned cover piece portions adapted to cover respective portions of opposite faces of said substrate not covered by said first and said second masking elements.

9. A device according to claim 8 wherein said open section of each of said masking elements of said first and second sets is rectangular, and said cover piece portions are disposed adjacent to a corner of the rectangular open section.

10. A device according to claim 8 wherein said cover piece portion of said first masking element of said second set has a thickness greater than that of said cover piece portion of said first masking element of said first set along a direction perpendicular to said plane, said cover piece portion of said second masking element of said second set has a thickness greater than that of said cover piece portion of said second masking element of said first set and greater than that of said first masking element of said second set along said direction, and said cover piece portion of said third masking element of said second set has a thickness greater than that of said cover piece portion of said third masking element of said first set and greater than that of said second masking element of said second set along said direction.

* * * * *